United States Patent [19]

Packer

[11] 4,279,073

[45] Jul. 21, 1981

[54] METHOD FOR RELEASING PRINTED WIRING BOARDS FROM PRINTED WIRING BOARD RACKS

[75] Inventor: Marvin Packer, Broomall, Pa.

[73] Assignee: RCA Corporation, New York, N.Y.

[21] Appl. No.: 101,486

[22] Filed: Dec. 10, 1979

[51] Int. Cl.³ .............................................. H05K 3/34
[52] U.S. Cl. ......................................... 29/832; 29/840; 106/2; 118/500; 427/96; 427/208; 428/352
[58] Field of Search .................... 29/832, 840; 427/91, 427/208; 106/2; 428/352; 118/500

[56] References Cited

U.S. PATENT DOCUMENTS

| | | | |
|---|---|---|---|
| 3,443,988 | 5/1969 | McCormack et al. | 118/500 |
| 3,625,715 | 12/1971 | Nasca | 106/2 |
| 3,745,028 | 7/1973 | Rayner | 106/2 |
| 3,829,319 | 8/1974 | Suzuki et al. | 106/2 |
| 3,973,322 | 8/1976 | Boynton | 29/840 |
| 4,127,692 | 11/1978 | Boynton | 427/96 |
| 4,166,150 | 8/1979 | Mattur | 428/352 |
| 4,215,025 | 7/1980 | Packer et al. | 260/29.2 R |

OTHER PUBLICATIONS

Condensed Chemical Dictionary, Van Nostrand Reinhold Co., pp. 171, 706 ©1971.

*Primary Examiner*—John D. Smith
*Attorney, Agent, or Firm*—Birgit E. Morris; Edward J. Sites

[57] ABSTRACT

A release coating for printing wiring board racks comprises 100 parts by weight of a polyethylene glycol having a molecular weight range of from about 3000 to 3700, about 20 to about 200 parts by weight of a liquid polyethylene glycol having a molecular weight range of from about 380 to about 420, and from 0 to about 35 parts by weight of water.

5 Claims, No Drawings

METHOD FOR RELEASING PRINTED WIRING BOARDS FROM PRINTED WIRING BOARD RACKS

This invention relates to holding racks for printed circuit boards. More specifically, this invention relates to holding racks for printed circuit boards wherein the printed circuit boards have been coated with a water soluble composition capable of adhering the electronic components thereto during soldering operations.

BACKGROUND OF THE INVENTION

Electronic components can be held on printed circuit boards during soldering operations if a composition as taught in U.S. application Ser. No. 864,624, filed Dec. 27, 1977 of Packer et al; entitled, *COATED PRINTED CIRCUIT WIRING BOARD AND METHOD OF SOLDERING* now U.S. Pat. No. 4,215,025, incorporated herein by reference, is applied to one side of the circuit board into which the component is inserted. The printed circuit boards are normally coated on a side with the adhesive composition and then inserted into a printed circuit board rack until the insertion of the components. Thereafter, the printed circuit boards are withdrawn from the racks and the components are inserted into the printed circuit board without lead clinching. The completed printed circuit boards are refitted back into the printed circuit board rack until the printed circuit boards containing the electronic components are soldered. Although the compositon adheres the electronic components to the printed circuit board, the composition tends to coat the sides of the printed circuit board rack with the composition. When the composition cures, the printed circuit boards are difficult to remove from the racks without dislodging the unsoldered electronic components.

Thus, a composition which does not damage the electronic components or the printed circuit board is necessary to prevent the sticking of the printed circuit board in the printed circuit board racks. In addition, the composition must be sufficiently water soluble so that any composition which adheres to the printed circuit board can be removed during the rinsing of the board after soldering.

SUMMARY OF THE INVENTION

A water soluble composition which prevents the sticking of printed circuit boards containing electronic components adhered to said printed circuit board by a sprayable, non-flowing water soluble composition comprises about 100 parts by weight of a solid polyethylene glycol having a molecular weight of from about 3000 to about 3700 present in about 20 to about 200 parts by weight of a liquid polyethylene glycol having a molecular weight of from about 380 to about 420 and from about 0 to about 35 parts by weight water. The composition when sprayed on the printed circuit board racks prevents the adherence of the printed circuit boards thereto. The composition is applied by either brushing or spraying onto the inside of the printed circuit board rack.

DETAILED DESCRIPTION OF THE INVENTION

The release coating composition of the present invention must be capable of permitting the withdrawal of printed circuit boards which have been coated with the composition for adhering electronic components thereto from printed circuit board racks. In addition, the composition must not interfere with the properties of the coating composition on the printed circuit board and must be water soluble. The coating composition suitable for satisfying the requirements of easy release and complete compatibility with the component adhesive and water comprises about 100 parts by weight of a polyethylene glycol having a molecular weight range of from about 3000 to about 3700, such as Carbowax 4000, a product of the Union Carbide Corporation, about 15 to about 30 parts by weight of a polyethylene glycol having a molecular weight of from about 380 to about 420, such as Carbowax 400, a product of the Union Carbide Corporation, and from 0 to about 35 parts by weight water. The high molecular weight polyethylene glycol adds body, stiffness and durability to the composition. The low molecular weight polyethylene glycol increases the water solubility of the composition and permits the washing of the composition from the board. The composition should have a greasy feel when rubbed between the fingers. Mixtures with freezing points greater than about 45° C. to about 66° C. satisfy the requirements.

The components of the composition are mixed together in a sealed container and heated in an oven to from about 75° C. to about 100° C. until all the components of the composition liquefy and form a solution. Higher temperatures can be used to speed the processing. The mixture is stirred to assure complete dissolution and thereafter permitted to cool to room temperature prior to coating the printed circuit board racks with the composition. The composition is applied to the racks by a brush or by spraying. The composition can also be applied to the edges of the printed circuit board racks. Alternatively, the composition can be applied while in the heated state. After application of the composition, the racks are allowed to dry and cool until the mixture congeals.

The addition of water in an amount up to about 35 parts by weight to the mixture extends the time and temperature range over which the coating can be applied to the printed circuit board racks before it solidifies. The water permits a longer brush life as the solution cools to room temperature. The concentration of water in the composition affects the thickness of the deposit of coating on the brush and on the printed wiring board racks. The greater the amount of water, the thinner the coating of the release composition.

Attempts to use either high weight polyethylene glycols, such as Carbowax 4000, or low weight liquid polyethylene glycol, such as Carbowax 400, were unsuccessful. The liquid polyethylene glycol is compatible with the holddown composition but is absorbed into the adhesive composition and the printed circuit boards stick to the rack. The high molecular weight polyethylene glycol is too solid at normal room temperatures to permit the easy insertion and withdrawal of the printed circuit board into the printed circuit board rack.

The invention will be further illustrated by the following Examples, but it is to be understood that the invention is not meant to be limited to the details described therein. In the Examples, all parts are by weight unless otherwise indicated.

EXAMPLE 1

A composition comprising 100 parts by weight of a polyethylene glycol having a molecular weight range of from about 3000 to about 3700 and about 50 parts by weight of a polyethylene glycol having a molecular weight of from about 380 to about 420 was mixed in a beaker and heated in an oven at 80° C. to form a solution. The composition was applied to a printed wiring board rack. Thereafter, printed wiring boards having the adhesive composition applied thereto were inserted into the rack and permitted to stand. The printed wiring boards were inserted and withdrawn without dislodgment of the components.

EXAMPLES 2-9

The following Examples were prepared with 100 parts by weight of a high molecular weight polyethylene glycol and varying amounts of the low molecular weight polyethylene glycol. The compositions were prepared in accordance with the procedures outlined for Example I. The compositions are tabulated in the Table below.

TABLE 1

|  | 2 | 3 | 4 | 5 | 6 | 7 | 8 | 9 |
|---|---|---|---|---|---|---|---|---|
| High Molecular Weight Polyethylene Glycol | 100 | 100 | 100 | 100 | 100 | 100 | 100 | 100 |
| Low Molecular Weight Polyethylene Glycol | 20 | 30 | 70 | 100 | 30 | 150 | 175 | 200 |
| $H_2O$ | — | — | — | — | 30 | — | — | — |

All the compositions permitted the insertion and withdrawal of the printed circuit boards from the printed circuit board rack and were easily rinsed from the printed circuit board.

COMPARATIVE EXAMPLE 1

A mixture of 100 parts by weight of a high molecular weight polyethylene glycol having a molecular weight range of from about 3000 to about 3700 was mixed with about 10 parts by weight of a low molecular weight polyethylene glycol having a molecular weight range of from about 380 to about 420. The mixture was heated as described in Example 1 and coated on a printed circuit board rack. Upon cooling, the composition was too stiff to permit the insertion and withdrawal of printed circuit boards into the printed circuit board racks without dislodging the components inserted into the printed circuit board.

COMPARATIVE EXAMPLE 2

A high molecular weight polyethylene glycol having a molecular weight range of from about 3000 to about 3700 was coated on a printed wiring board rack. The composition was too stiff to permit the insertion and withdrawal of printed circuit boards from the printed circuit board rack.

What is claimed is:

1. In a process of assembling printed circuit boards without lead clinching of the components to the printed circuit board which comprises coating a side of the printed circuit board into which the electronic components are inserted with a sprayable, non-flowing, water soluble adhesive composition, inserting the coated board in a printed circuit board rack, removing the printed circuit board, inserting the electronic components therein, and storing the printed circuit board containing the components in the printed circuit board rack prior to soldering the components thereto, the improvement comprises:

coating the printed circuit board racks with a water rinsable, non-corrosive composition which is compatible with the non-flowing water-soluble adhesive composition comprising about 100 parts by weight of a polyethylene glycol having a molecular weight range of from about 3000 to about 3700, 20 to about 200 parts by weight of a polyethylene glycol having a molecular weight range of from about 380 to about 420 and from about 0 to about 35 parts by weight of water.

2. The process according to claim 1 wherein the composition contains about 30 parts by weight water.

3. The process according to claim 1 wherein the composition contains from about 20 to about 100 parts by weight of a polyethylene glycol having a molecular weight range of from about 380 to about 420.

4. The process according to claim 3 wherein the composition contains about 30 parts by weight of water.

5. The process according to claim 4 wherein the composition comprises about 100 parts by weight of a polyethylene glycol having a molecular weight range of from about 3000 to about 3700, about 30 parts by weight of a polyethylene glycol having a molecular weight range of from about 380 to about 420, and about 30 parts by weight water.

* * * * *